United States Patent [19]
Ribner

[11] Patent Number: 5,392,043
[45] Date of Patent: Feb. 21, 1995

[54] DOUBLE-RATE SAMPLED SIGNAL INTEGRATOR

[75] Inventor: David B. Ribner, Schenectady, N.Y.

[73] Assignee: General Electric Company, Schenectady, N.Y.

[21] Appl. No.: 131,537

[22] Filed: Oct. 4, 1993

[51] Int. Cl.$^6$ .................... H03M 3/02; H03M 1/50
[52] U.S. Cl. .................... 341/143; 341/172
[58] Field of Search ............ 341/143, 172, 155; 375/26–29, 33, 34

[56] References Cited

U.S. PATENT DOCUMENTS

| | | | |
|---|---|---|---|
| 4,633,223 | 12/1986 | Senderowicz | 341/172 |
| 4,876,543 | 10/1989 | Van Bavel | 341/143 |
| 4,896,156 | 1/1990 | Garverick . | |
| 4,920,544 | 3/1990 | Endo et al. | 341/143 |
| 4,939,516 | 7/1990 | Early . | |
| 5,030,954 | 7/1991 | Ribner . | |
| 5,039,989 | 8/1991 | Welland et al. . | |
| 5,148,166 | 9/1992 | Ribner . | |
| 5,148,167 | 9/1992 | Ribner . | |

OTHER PUBLICATIONS

"A Monolithic 20–b Delta–Sigma A/D Converter," Bruce P. Del Signore, Donald A. Kerth, Navdeep S. Sooch, Eric J. Swanson, IEEE Journal of Solid–State Circuits, vol. 25, No. 6, Dec. 1990, pp. 1311–1316.
"An Oversampling Converter for Strain Gauge Transducers," Donald A. Kerth, Douglas S. Piasecki, IEEE Journal of Solid–State Circuits, vol. 27, No. 12, Dec. 1992, pp. 1689–1696.
"Filter Synthesis Using the Bilinear Transform," Peter Gillingham, Switched Capacitor Circuits for VLSI: A Design Study, Carleton Electronics Research Laboratory, Technical Report No. CERL 83–02, Chapter 4.2, Jan. 1983, pp. 64–68.

Primary Examiner—Sharon D. Logan
Attorney, Agent, or Firm—Enrique J. Mora; Marvin Snyder

[57] ABSTRACT

A sampled signal integrator is provided comprising: an amplifier; two pairs of capacitors, the first pair of capacitors being coupled between the input and output terminals of the amplifier in a conventional negative feedback configuration, and the second pair of capacitors being coupled to the input terminals of the amplifier by a first pair of switches and likewise being coupled to a Voltage source by a second pair of switches; the two pairs of switches being further cross-coupled or synchronized to accomplish double-rate integration; and a voltage bias coupled in shunt with each of the input terminals of the amplifier to thereby provide a common mode bias to the integrator. Likewise, in another embodiment of the invention, the output signals of a sampled signal integrator configured so as to accomplish double-rate integration may be modulated and decimated to reduce or remove DC or low frequency noise.

25 Claims, 5 Drawing Sheets

DOUBLE-RATE SAMPLED SIGNAL INTEGRATOR

FIELD OF THE INVENTION

This invention relates to analog-to-digital converters (ADC's) and, more particularly, to analog-to-digital converters employing a switched-capacitor (SC) integrator.

BACKGROUND OF THE INVENTION

Low noise integrators are desirable for delta-sigma analog-to-digital converters and switched-capacitor filters because the noise of the integrator is typically dominant for the overall circuit incorporating the integrator. Low noise switched-capacitor integrators, such as described in U.S. Pat. No. 4,896,156, entitled "Switched-Capacitance Coupling Networks for Differential-Input Amplifiers, Not Requiring Balanced Input Signals," by Garverick, issued Jan. 23, 1990; U.S. Pat. No. 4,939,516, entitled "Chopper Stabilized Delta-Sigma Analog-to-Digital Converter," by Early, issued Jul. 3, 1990; U.S. Pat. No. 5,039,989, entitled "Delta-Sigma Analog-to-Digital Converter With Chopper Stabilization at the Sampling Frequency," by Welland et al., issued Aug. 13, 1991; and U.S. Pat. No. 5,148,167, entitled "Sigma-Delta Oversampled Analog-to-Digital Converter Network with Chopper Stabilization," by Ribner, issued Sep. 15, 1992, all of the foregoing herein incorporated by reference, frequently employ chopper stabilization and may operate at a rate of one-half the signal sampling rate, $F_S$, or below, to cancel low frequency noise, primarily "1/f" noise, and any direct current (DC) offset. Unfortunately, in an oversampled delta-sigma modulator, "chopping" at a frequency of approximately $F_S/2$ may result in modulation of the quantization noise of the modulator down to low frequency levels or may cause a DC offset. This may occur because the quantization noise achieves its peak at $F_S/2$ due to the noise shaping of the delta-sigma modulator, as described, for example, in D. Kerth and D. Piasecki, "An Oversampling Converter for Strain Gauge Transducers," appearing in *IEEE Journal of Solid-State Circuits*, Vol. 27, No. 12, December, 1992, herein incorporated by reference and as described elsewhere. A need thus exists for a sampled signal integrator for use in analog-to-digital conversion that overcomes this noise problem.

SUMMARY OF THE INVENTION

One object of the invention is to provide a sampled signal integrator capable of integrating at twice the rate of conventional sampled signal integrators for a given clock rate.

A second object is to provide a sampled signal integration with low input-referred offset and "1/f" noise.

Another object is to provide a sampled signal integrator that avoids the modulation of quantization noise down to low or pass band frequencies.

Yet another object is to provide a sampled signal integrator capable of accepting single-ended input signals.

One more object is to provide a sampled signal integrator having reduced thermal noise in comparison with conventional sampled signal integrators.

Briefly, in accordance with one embodiment of the invention, a sampled signal integrator comprises: an amplifier; two pairs of capacitors, the first pair of capacitors being coupled between the input and output terminals of the amplifier in a conventional negative feedback configuration, and the second pair of capacitors being coupled to the input terminals of the amplifier by a first pair of switches and likewise being coupled to a voltage source by a second pair of switches; the two pairs of switches being further cross-coupled or synchronized to accomplish double-rate integration; and a voltage bias coupled in shunt with each of the input terminals of the amplifier to thereby provide a common mode bias to the integrator.

Likewise, in another embodiment of the invention, the output signals of a sampled signal integrator configured so as to accomplish double-rate integration may be modulated and decimated to reduce or remove DC or low frequency noise.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

DETAILED DESCRIPTION OF THE INVENTION

Figure 1:
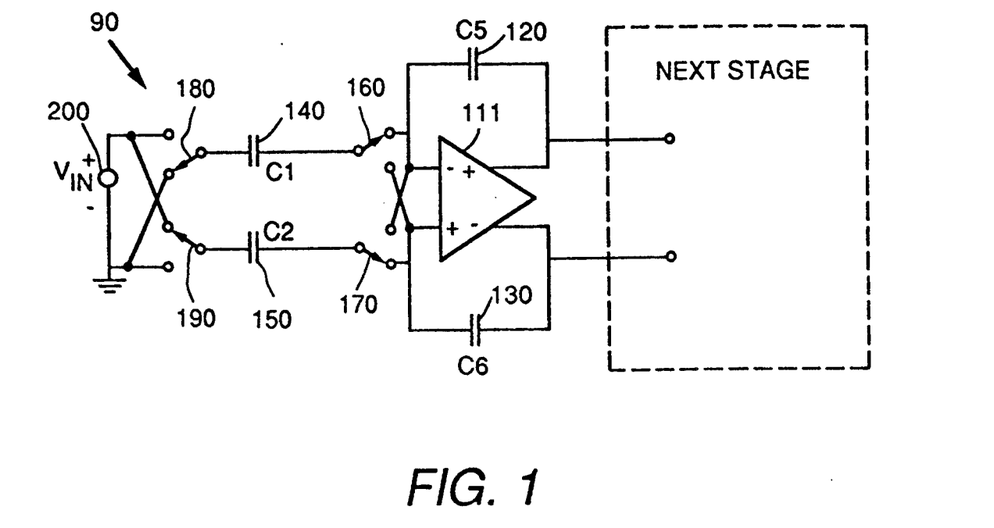
FIG. 1 is a circuit diagram illustrating an embodiment of a double-rate sampled signal integrator.

FIG. 1 illustrates double-rate sampled signal integrator 90. In the context of the invention, double-rate integration refers to performing on one cycle of a clock pulse, $T_{CL}$, the integration of two signal samples, such as voltage signal samples. Typically, this may be accomplished by integrating on the alternative phases of the clock pulse, as explained and described in more detail hereinafter. Integrator 90 may comprise a balanced or fully differential operational amplifier 111 with feedback capacitors 120 and 130 and switched capacitors 140 and 150. Each respective switch in a first pair of switches, 180 and 190, selectively couples a terminal of respective switched capacitors 140 and 150 between the terminals of externally derived voltage source 200, providing voltage signal $V_{IN}$. Respective switched capacitors 140 and 150 have a remaining or other terminal. The respective remaining terminals are selectively coupled by respective switches in a second pair of switches, 160 and 170, between the input terminals of operational amplifier 111. In the context of the invention, a switch that selectively couples a first terminal or node between two other terminals or nodes, that is between a second terminal and a third terminal, periodically couples the first terminal to one of the two other terminals, such as the second terminal, and then periodically couples the first terminal to the other of the two other terminals, in this case the third terminal, during the time period when the first terminal is not coupled to the one of the other two terminals, in this case the second terminal. It will now be appreciated that switching activity or operation may be controlled or driven by an externally derived clock providing a periodic waveform at a predetermined rate or frequency $F_{CL}$, such as clock pulses constituting a two-phase clock signal. For example, the externally-derived clock pulse may constitute a square wave pulse with a period $T_{CL}=1/F_{CL}$. Likewise, the input voltage signal sampling rate is designated $F_S$. Switched capacitance resistors, such as realized by switched capacitors 140 and 150, are described in more detail at pages 277–280 of R. Gregorian, *Analog MOS Integrated Circuits for Signal Processing*, available from Wiley, N.Y. (1986), herein incorporated by reference.

As illustrated in FIG. 1, both the input terminals and the output terminals of amplifier 111, here a differential amplifier, have opposite polarities. More specifically, for a differential amplifier of the type illustrated, each output terminal provides a voltage signal substantially representing the difference of the voltage signals provided to each input terminal. Furthermore, the two output voltage signals provided have opposite polarity. As illustrated, capacitors 120 and 130 couple each of the input terminals of amplifier 111 to the output terminal having opposite polarity to provide a conventional negative feedback configuration.

As illustrated, each respective switch in the second pair of switches, 160 and 170, is adapted to selectively couple a first terminal of one of the respective switched capacitors, 140 and 150, between the input terminals of amplifier 111. Likewise, each respective switch in the first pair of switches, 180 and 190, is adapted to selectively couple a second or other terminal of one of the respective switched capacitors,, 140 and 150, between the terminals of externally derived voltage source 200.

Figure 3:
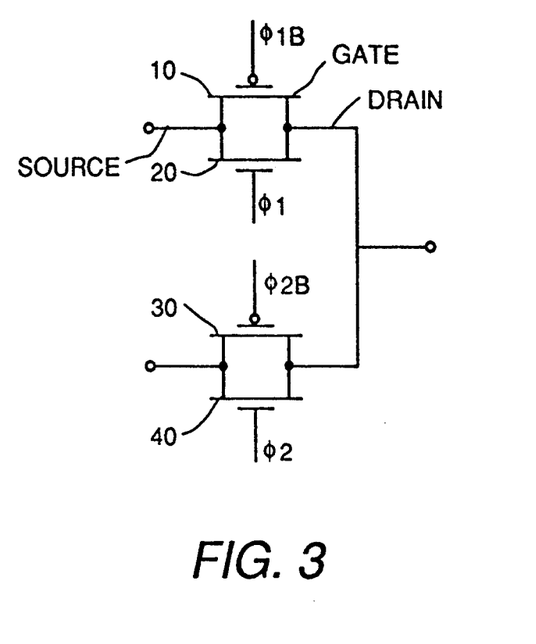
FIG. 3 is a circuit diagram illustrating one embodiment of a single-pole, double-throw (SPDT) switch, such as may be employed in a double-rate sampled signal integrator in accordance with the invention.
Figure 3A:
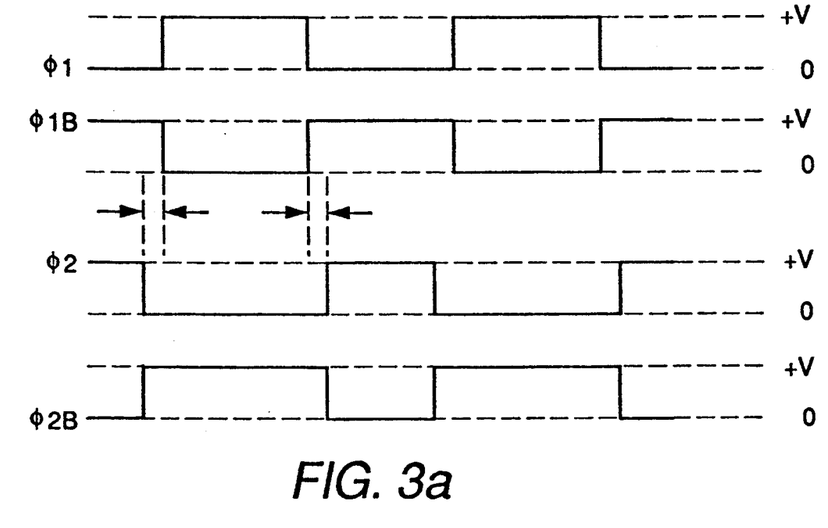
FIG. 3a is a timing diagram illustrating nonoverlapping clock pulses of an externally derived clock that may drive the embodiment of the single-pole, double-throw switch illustrated in FIG. 3.

Switches 160 and 170 in the second pair of switches are mutually synchronized or adapted to respectively selectively couple the first terminal of respective switched capacitors, 140 and 150, between the input terminals of amplifier 111 so that during successive switching each input terminal of amplifier 111 is alternatively coupled to a different capacitor. Therefore, during switching operation or one switching cycle, switches 160 and 170 are synchronized so that the switched capacitors switch or exchange the particular input terminal of amplifier 111 to which each capacitor is coupled. One of the switches may comprise, for example, four CMOS transmission gates, coupled as illustrated in FIG. 3 to realize a conventional single-pole, double-throw (SPDT) switch. In this context, use of CMOS-based technology provides a number of advantages including ease of manufacturing for large scale integration and avoiding the necessity of supplying a gate bias current, as is typically required for bipolar transistors. Nonetheless, other devices that may prove suitable as switches in the context of the invention include bipolar transistors, junction field effect transistors (JFETs), gallium arsenide metal semiconductor field effect transistors (MESFETs), relays, and Schottky and other diode bridges. FIG. 3a further illustrates the timing for clock pulses or CMOS transmission gates 10, 20, 30 and 40 to realize the single-pole, double-throw switch (SPDT). As illustrated in FIG. 3a, the timing signals between various gates are nonoverlapping to avoid undesired conduction paths between the various CMOS gates. Likewise, the alternative clock phases, $\phi_1$ and $\phi_2$, for one clock cycle are illustrated.

Switches 180 and 190 in the first pair of switches are also mutually synchronized or adapted to respectively selectively couple the second or remaining terminal of respective switched capacitors, 140 and 150, between the terminals of the externally derived voltage source so that during successive switching cycles each voltage source terminal is alternatively coupled to a different capacitor. Again, switches 180 and 190 are synchronized so that the switched capacitors exchange the particular voltage source terminal to which each is coupled. Again, each single-pole, double-throw switch may be realized as four coupled CMOS transmission gates, as illustrated in FIG. 3. Furthermore, this first and second pair of switches, 160, 170, 180 and 190, are mutually synchronized or cross-coupled so that switches in the first pair exchange or switch voltage source terminals during switching operation or during one switching cycle at substantially the same time switches in the second pair exchange or switch amplifier input terminals. This may be accomplished, for example, by a conventional double-pole, double-throw switching configuration. In one embodiment, during switching operation, an externally derived clock may drive the two pairs of switches at a predetermined clock frequency with $F_{S=2}F_{CL}$ so that synchronization to accomplish double-rate integration is achieved.

The circuit illustrated in FIG. 1 results in the summation of two samples of the voltage signal, $V_{IN}$, the samples being taken at two separate times, such as on alternate phases of an externally derived two-phase clock controlling the pairs of switches. It will be appreciated, of course, that the invention is not restricted in scope to being driven by a two-phase clock. Furthermore, virtually any "duty" cycle would prove satisfactory, although substantially equal phases for the two-phase clock may provide advantages in terms of speed and circuit settling time. The sampled voltage signals are thereby injected, as an electrical charge, into the capacitors of the integrator on the alternate clock phases, such as those illustrated in FIG. 3a. Thus, the amplifier configuration integrates at twice the rate of a conventional integrator for a single clock pulse by integrating two sampled voltage signals in one clock period, $T_{CL}$. Integration takes place twice as frequently without any need to increase the clock rate, $F_{CL}$. The z-transform of such a sampled voltage signal integrator, relative to $F_{CL}$, is provided by equation 1.

$$\frac{V_O(z)}{V_{IN}(z)} = \alpha \left( \frac{1 + z^{-\frac{1}{2}}}{1 - z^{-\frac{1}{2}}} \right), \quad [1]$$

where $\alpha =$ $$C1/C5 = C2/C6 \quad [1a]$$

C1, C2, C5, and C6 designate the respective capacitances of the circuit components illustrated in FIG. 1. The time domain difference equation for this transfer function is provided below.

$$V_o(nT_{CL}) - V_o((n-\tfrac{1}{2})T_{CL}) = \alpha[V_{IN}(nT_{CL}) + V_{IN}((n-\tfrac{1}{2})T_{CL})] \quad [2]$$

$V_o(t)$ and $V_{IN}(t)$ respectively indicate the sampled output voltage signal and sampled input voltage signal at time t. Because the bilinear transform "maps" the continuous frequency variable s to the discrete time variable z according to $$s = (1 - z^{-1})/(1 + z^{-1}) \quad [3]$$

the circuit illustrated in FIG. 1 may in theory be employed to execute or physically realize the bilinear transform of $\alpha/s$, or the integration operation. The desirable double-rate behavior in equation [1] is indicated by $z^{-\frac{1}{2}}$ instead of $z^{-1}$. Likewise, at low frequencies relative to $F_{CL}$, the numerator of the transfer function in equation [1] is approximately $2\alpha$. The factor of 2 is introduced due to the double-rate integration being accomplished.

Figure 2:
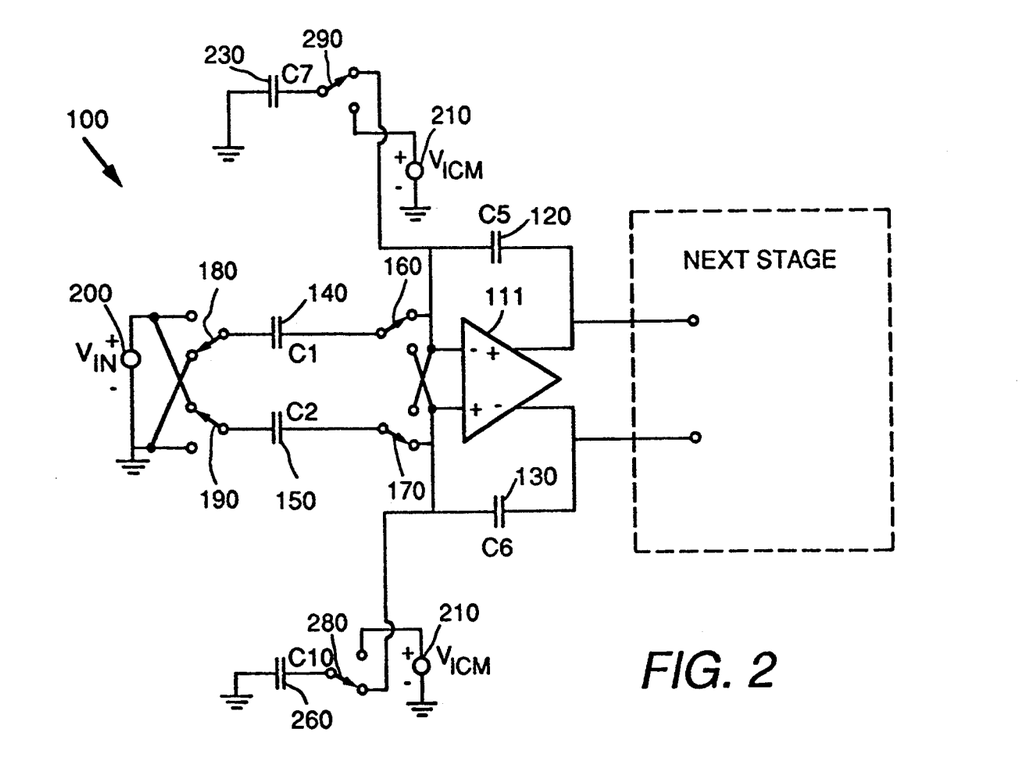
FIG. 2 is a circuit diagram illustrating an embodiment of a double-rate sampled signal integrator in accordance with the invention.

An important modification of FIG. 1 is illustrated in FIG. 2. The double-rate sampled signal integrator illustrated in FIG. 1 will not work in actual practice because no resistive path to a voltage source or to ground for the amplifier input terminals is provided. This problem is overcome by a sampled signal integrator 100 in accordance with the invention, such as the embodiment illustrated in FIG. 2. A common mode bias, such as a voltage bias, may be provided in shunt with each of the amplifier input terminals. In FIG. 2, a voltage bias is coupled directly in shunt with each of the input terminals of amplifier 111. In the context of the invention, the term bias refers to a signal, such as an electrical signal, typically a current or voltage, that provides a reference signal or a signal reference point for the remaining signals in the circuit or system during system operation or signal processing. This bias may be accomplished or physically realized for a sampled signal integrator by a number of different techniques.

For the embodiment illustrated in FIG. 2, a first switched capacitor, 230, and a second switched capacitor, 260, are each respectively coupled in series with voltage source 210 to provide a switched charge path that resistively biases the respective differential amplifier input terminals to $V_{ICM}$ during steady state operation of the circuit. Again, the switches may be synchronized by an externally derived clock or by an "N-pole, double throw" switch configuration. As illustrated, single-pole, double-throw switch 290 is provided in series with capacitor 230 and single-pole, double-throw switch 280 is provided in series with capacitor 260 so that each switched capacitor coupled in series with voltage source 210 provides an effective resistance in series with voltage source 210 and effectively provides a common-mode voltage bias in shunt with each amplifier input terminal. Although both input terminals require such a common mode bias, one voltage bias is satisfactory to bias both terminals. Use of switched capacitive resistors in this manner is described in the aforesaid Gregorian text. Alternatively, a resistor may be coupled in series or a switched capacitor pair may be coupled in series with the voltage source to provide the voltage bias, such as, for example, the capacitor pairs illustrated in FIG. 5. Likewise, due to the symmetry of the configuration, the voltage bias may be equivalently coupled in shunt with the amplifier input terminals through a switch, such as single-pole, double-throw switches 160 and 170, although the resistance of the particular switch should be sufficiently low to have a negligible impact on circuit performance.

The embodiment of a double-rate sampled signal integrator illustrated in FIG. 2, therefore, physically realizes a circuit that may accomplish the bilinear transform. This provides convenient and desirable advantages for the design of sampled data filters, and is also useful in designing delta-sigma modulator configurations. Furthermore, although other circuits have been realized that may implement the bilinear transform, the embodiment in FIG. 2 realizes it with double-rate integration and with reduced sensitivity to stray parasitic capacitances. The embodiment illustrated may also accommodate both single-ended input signals and fully balanced input signals in comparison with other balanced integrator circuits that require such fully balanced input signals for satisfactory performance. Furthermore, the invention is not restricted in scope to using a fully balanced or differential amplifier. For example, if a conventional operational amplifier were employed, double-rate integration may be accomplished by coupling to ground the terminal of capacitor 130 coupled in FIG. 2 to the negative output terminal of amplifier 111. Likewise, such an embodiment may be chopper stabilized internally in a manner similar to the approach described in more detail hereinafter with respect to FIG. 5.

Figure 4:
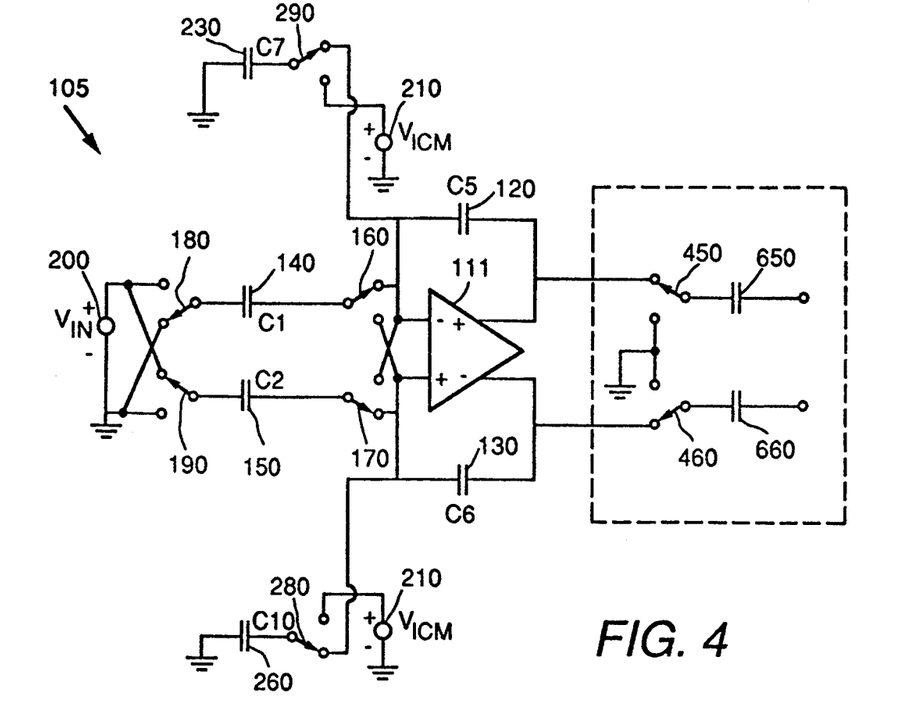
FIG. 4 is a circuit diagram illustrating an alternative embodiment of a double-rate sampled signal integrator in accordance with the invention.

FIG. 4 illustrates another alternative embodiment 105 of a double-rate sampled signal integrator in accordance with the invention. In this particular embodiment, the output terminal of the double-rate integrator 100 illustrated in FIG. 2 is sampled at a rate $F_{CL}$ or one-half the signal sampling rate, $F_S$, thereby decimating it by a factor of 2. In the context of the invention, decimation refers to the act of sampling at a lower frequency submultiple of $F_S$ and, thus, may remove undesirable noise present in particular, usually high, frequency bands. Two decimators are provided in FIG. 4, illustrated by switches 450 and 460, each of the decimators being selectively coupled between a separate output terminal of amplifier 111 and ground as part of a capacitive coupling configuration. Thus, in this particular embodiment, the decimation is accomplished by following the integrator with a conventional switched capacitor input stage that samples the output voltage signal on one phase of the externally derived clock pulse and switches to ground on the alternative phase, as illustrated. Alternatively, switches 450 and 460 may, instead of switching to ground on alternative clock phases, switch to a position so that the capacitors shown, 650 and 660, are coupled together. The resulting transfer function for the decimated integrator illustrated in FIG. 4 is provided by equation [4] below.

$$\frac{V_O(z)}{V_{IN}(z)} = \alpha \left( \frac{(1 + z^{-\frac{1}{2}})^2}{1 - z^{-1}} \right). \quad [4]$$

After signal decimation, the double-rate integrator operates as a single-rate integrator and no longer implements the bilinear transform; however, at low frequencies relative to $F_{CL}$, the numerator of the transfer function is approximately $4\alpha$. Thus, one advantage of such an integrator is the resulting improved signal-to-noise ratio with respect to the thermal noise of the integrator when employed in a circuit.

Figure 5:
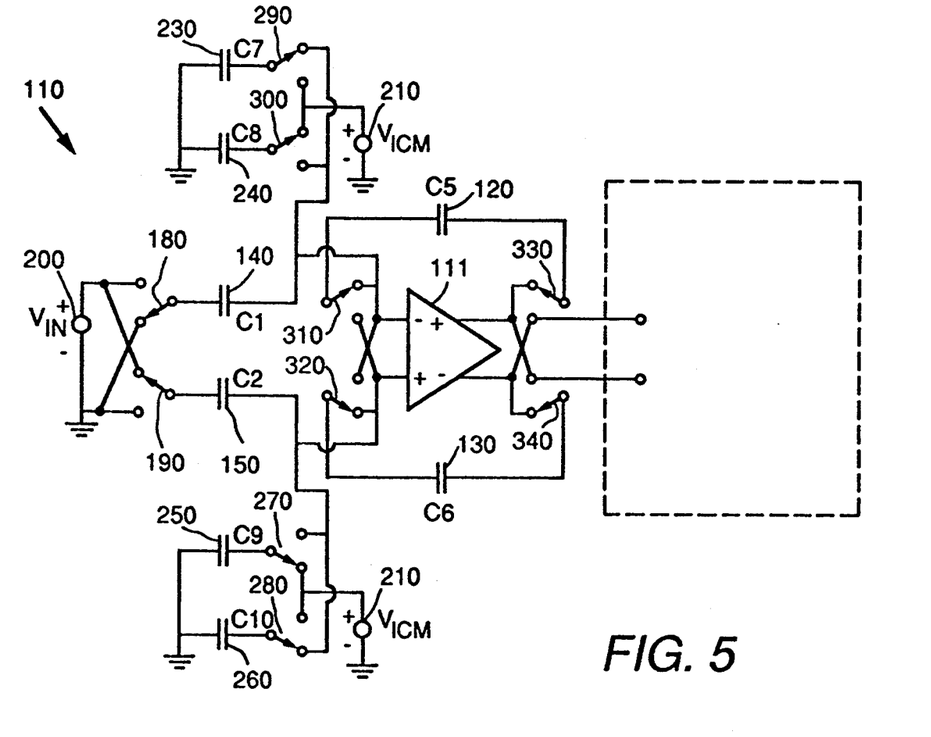
FIG. 5 is a circuit diagram illustrating one more alternative embodiment of a double-rate sampled signal integrator in accordance with the invention.

FIG. 5 illustrates yet another alternative embodiment 110 of a double-rate sampled integrator in accordance with the invention. In this particular embodiment, chopper stabilization is incorporated into the integrator illustrated in FIG. 2 to cancel the DC offset and low frequency "1/f" noise of the amplifier. Chopping at a frequency of $f_C=F_{CL}$ modulates the low frequency noise out of the signal pass band, where $f_C$ designates the "chopping" frequency. Because a double-rate sampled signal integrator in accordance with the invention is employed, chopping at $F_{CL}$ is equivalent to chopping at one-half the sampling rate, that is $F_S=2F_{CL}$. The chopping is implemented using two pairs of single-pole, double-throw switches, output switches 330 and 340 synchronized with input switches 310 and 320, to periodically alternate the polarity of the input and output signals of the fully balanced or differential operational amplifier at a predetermined chopping frequency; however, an important aspect of the embodiment illustrated in FIG. 5 is that switch sharing is possible due to the circuit configuration for this embodiment of a double-rate sampled signal integrator in accordance with the invention. Without switch sharing, two more pairs of single-pole, double-throw switches would be present to implement such a chopped, double-rate sampled signal integrator. Thus, the chopper switches also implement the switched-capacitor resistors at the input and output terminals of the amplifier while avoiding additional complexity in the circuitry.

Each respective switch in the first pair of switches, 310 and 320, is adapted to selectively couple the first terminal of respective capacitors 120 and 130 between the input terminals of amplifier 111. Likewise, each respective switch in the second pair of switches, 330 and 340, is adapted to selectively couple the second, or remaining, terminal of respective capacitors 120 and 130 between the output terminals of amplifier 111. Likewise, the first and second pairs of switches, 310, 320, 330 and 340, are synchronized so that during successive switching operation respective input terminals of the amplifier are coupled to respective output terminals so as to provide a negative feedback configuration and substantially simultaneously reverse the polarity of the input voltage signals and the output voltage signals of amplifier 111 so as to accomplish modulation of the output voltage signals by a square wave or, more particularly, chopper stabilization. These switches may be driven or synchronized by an externally derived clock as previously described.

In FIG. 5, the common mode bias coupled in shunt with each of the amplifier input terminals is realized by a pair of switched capacitors coupled to a voltage source, such as capacitors 230 and 240 respectively coupled in series with SPDT switches 290 and 300 and capacitors 250 and 260 respectively coupled in series with SPDT switches 270 and 280. In comparison with the embodiments of a sampled signal integrator in accordance with the invention illustrated in FIGS. 2 and 4, the embodiment illustrated in FIG. 5 uses a pair of switched capacitors so that the gain characteristics of the integrator for input-referred noise match on alternative phases of a externally-derived two-phase clock pulse. This is desirable for satisfactory operation for this particular embodiment due to the presence of chopper stabilization which requires that the noise characteristics of the integrator match on alternative phases for the noise to be effectively modulated, or chopper stabilized, by reversing the polarity of the input and output signals, performed at the input and output terminals of the amplifier.

Figure 6:
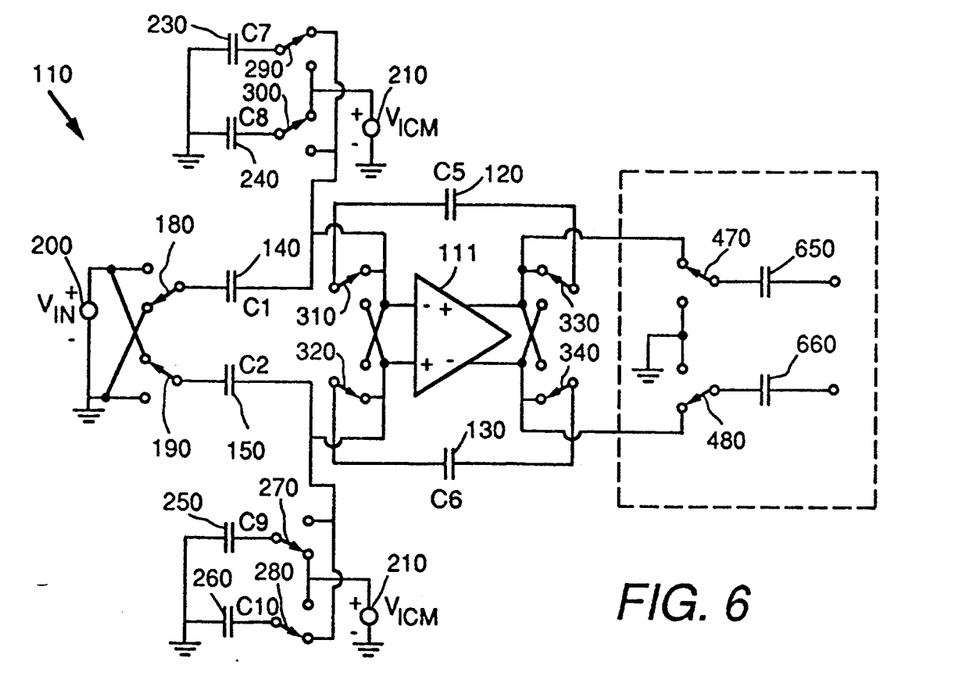
FIG. 6 is a circuit diagram illustrating yet another alternative embodiment of a double-rate sampled signal integrator in accordance with the invention.

Adding decimation to the embodiment illustrated in FIG. 5 provides yet another embodiment in accordance with the invention, such as integrator 110 illustrated in FIG. 6. Decimation is realized by the pair of single-pole, double-throw switches 470 and 480, like switches 450 and 460 illustrated in FIG. 5. The combination of the double-rate sampled signal integrator with decimation results in an integrator that, although operating at a double rate, has its output signal sampled at the decimation rate of $F_{CL}$. In addition to those advantages previously described that a double-rate sampled signal integrator in accordance with the invention may provide, the embodiment illustrated in FIG. 6 also provides advantages beyond a conventional chopper stabilized integrator.

One advantage offered by the embodiment illustrated in FIG. 6 may be realized by considering the embodiment illustrated in FIG. 5 in a conventional delta-sigma modulator configuration. As described, integration takes place at $F_S=2F_{CL}$. Likewise, conventional chopper stabilization modulates or frequency shifts signals by the chopping frequency, here $f_C=F_S/2=F_{CL}$. For such a delta-sigma modulator configuration, as previously discussed, the quantization noise peaks at $F_S/2$ or $F_{CL}$, which is modulated to DC or low frequencies due to chopping at $F_S/2$. In the embodiment illustrated in FIG. 6, by contrast, noise is cancelled by a technique other than conventional chopper stabilization. Instead, the noise is cancelled due to the integration of signals of opposing polarity, introduced by the switching technique employed in FIG. 6 in a manner reminiscent of correlated double sampling, such as described in, for example, "The Output Power Spectrum Produced by Correlated Double Sampling," written by J. M. Pimpley and G. J. Michon, and published in *IEEE Transactions on Circuits and Systems*, Vol. 38, No. 9, pp. 1086–1090, September 1991.

More particularly, due to the operation of switches 470 and 480, the embodiment of the double-rate sampled signal integrator illustrated in FIG. 6 integrates or accumulates two consecutive signal samples occurring on alternative phases of the externally-derived clock operating at a frequency $F_{CL}$. Instead of shifting the DC or low frequency noise signals out of the pass band, as is typically accomplished with chopper stabilization, the switching activity performed on the input signals and the output signals of the amplifier to accomplish double-rate integration has the effect of reversing the polarity of consecutive sampled signals on alternative clock phases. Thus, by summing or integrating the consecutive sampled signals, the DC or low frequency components of the noise effectively cancel. As illustrated in FIG. 6, the output signal provided to the next stage of the integrator is taken directly from the output terminal of operational amplifier 111 in FIG. 6; however, it may also be taken from a terminal of capacitor 120 and capacitor 130 coupled to switches 330 and 340, respectively.

The transfer function for the embodiment illustrated in FIG. 6 is provided by the following equation:

$$V_O(z) = \alpha \left( \frac{(1 + z^{-\frac{1}{2}})^2}{1 - z^{-1}} \right) V_{IN}(z) + \qquad [5]$$

$$\left[ 1 + \alpha \left( \frac{(1 - z^{-\frac{1}{2}})^2}{1 - z^{-1}} \right) \right] V_{NZ}(z),$$

where $V_{NZ}(Z)$ represents the "input-referred" noise of amplifier 111. The first term in equation [5] is the input signal transfer function whereas the second term is the noise transfer function. Dividing the noise transfer function by the signal transfer function provides the transfer function for the input-referred noise of the integrator as follows.

$$\frac{V_{IN}(z)}{V_{NZ}(z)} = \left( \frac{1 - z^{-1}}{\alpha (1 + z^{-\frac{1}{2}})^2} \right) + \left( \frac{1 - z^{-\frac{1}{2}}}{1 + z^{-\frac{1}{2}}} \right)^2. \qquad [6]$$

It should now be apparent by inspection that the first term in equation [6] dominates at low frequencies relative to $F_{CL}$ and, furthermore, introduces a zero at DC thereby cancelling the "1/f" noise and any DC offset of the amplifier.

Likewise, the embodiment illustrated in FIG. 6 may be modified in various ways to provide even greater flexibility in actual use. One possible modification is adjustment of the decimation or output signal sampling rate, such as realized by single-pole, double-throw switches 470 and 480. Instead of sampling on every other output signal, the switches may sample every nth output signal, where n is an even integer. Furthermore, the polarity of the integrators may be inverted by reversing or inverting the switching sequence. Likewise, multiple input signals may be accommodated, such as by using, for example, additional switches and capacitors.

Figure 7:
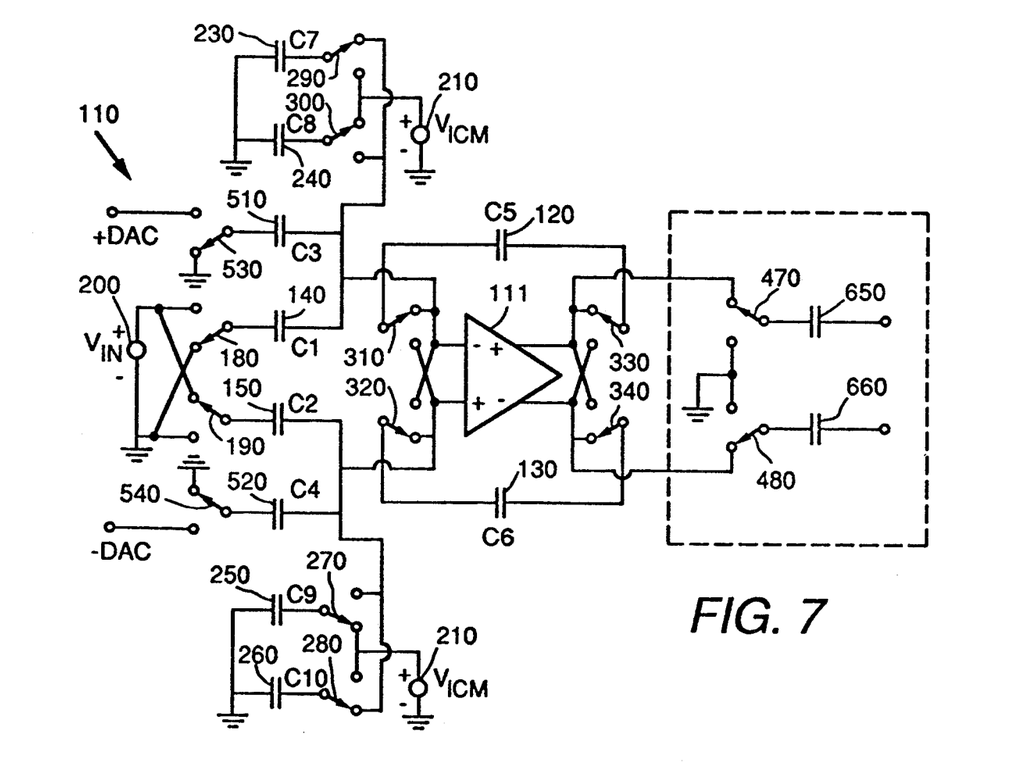
FIG. 7 is a circuit diagram illustrating yet one more alternative embodiment of a double-rate sampled signal integrator in accordance with the invention.
Figure 8:
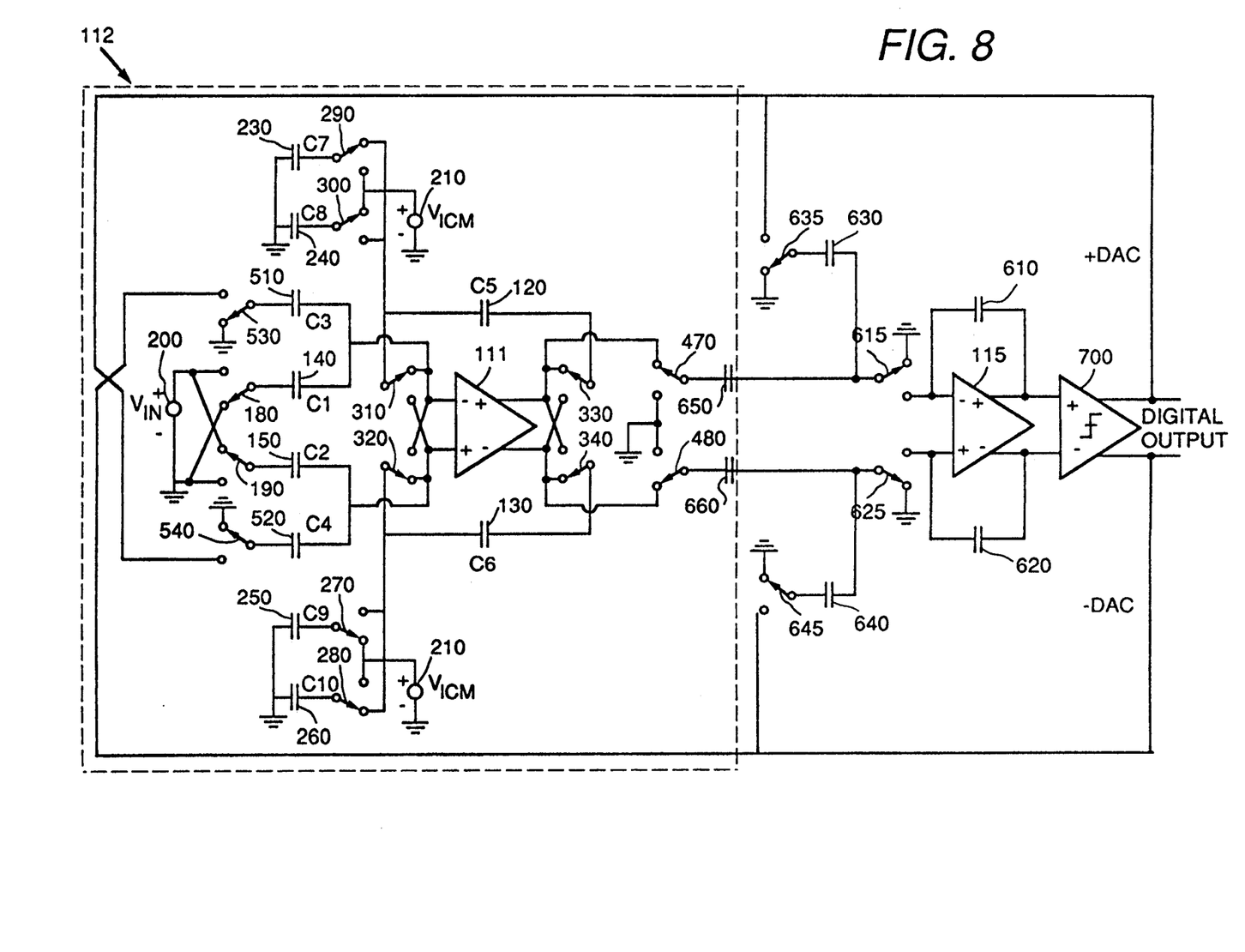
FIG. 8 is a circuit diagram illustrating the embodiment of FIG. 7 in a second-order delta-sigma modulator configuration.

FIG. 7 is a circuit diagram of yet another embodiment of a double-rate sampled signal integrator in accordance with the invention. The embodiment illustrated in FIG. 7 is employed as illustrated in FIG. 8 to specifically address the use of such an integrator as a component of a delta-sigma modulator configuration. In a delta-sigma modulator of the type illustrated, the input signal provided to the amplifier may be provided by the output terminal of a digital-to-analog converter, such as a switched connection to a bipolar voltage reference source. In equation [4] (or equation [5]), however, the numerator for the double-rate sampled signal integrator introduces a high frequency zero that will not permit a higher bandwidth signal, such as may be provided by a digital-to-analog converter, to pass through the modulator substantially unaffected. The embodiment in FIG. 7 provides one approach to solving this problem by providing a pair of capacitors, such as 510 and 520, each respective capacitor having a first terminal coupled to a separate one of the input terminals of the amplifier and the second or other capacitor terminal coupled to a single-pole, double-throw switch, such as either switch 530 or switch 540 in FIG. 7. Each switch is adapted to selectively couple the second capacitor terminal of the coupled capacitor between ground and an output terminal of the digital-to-analog converter. Because each switch only couples either 510 or 520 to the DAC output signal on one phase, rather than both phases, of the external clock, the output signal of the digital-to-analog converter is not sampled at the double-rate of the integrator. This has the desirable effect of avoiding the zero just described in the transfer function of the integrator. The transfer function of the embodiment illustrated in FIG. 7 is provided in equation [7] below.

$$V_O(z) = \alpha \left( \frac{(1 + z^{-\frac{1}{2}})^2}{1 - z^{-1}} \right) V_{IN}(z) + \left( \frac{2\beta z^{-\frac{1}{2}}}{1 - z^{-1}} \right) V_{DAC}(z) + \qquad [7]$$

$$\left[ 1 + (\alpha + \beta) \left( \frac{(1 - z^{-\frac{1}{2}})^2}{1 - z^{-1}} \right) \right] V_{NZ}(z),$$

where $\beta = C3/C5 = C4/C6$. With respect to the digital-to-analog converter signal, the circuit effectively operates as a conventional single-rate sampled signal integrator.

Finally, FIG. 8 illustrates yet one more embodiment of a double-rate sampled signal integrator 112 in accordance with the invention. As suggested previously, this particular embodiment illustrates a realization of a delta-sigma modulator employing a double-rate sampled signal integrator in accordance with the invention, here a second-order modulator. Typically, such a modulator would be followed by a digital filter and a decimator in cascade. This particular embodiment includes the embodiment illustrated in FIG. 7 having its output terminals coupled to a conventional switched capacitance integrator configuration including fully balanced or differential operational amplifier 115 and feedback capacitors 610 and 620. Single-pole, double-throw switches 635 and 645, and respectively corresponding capacitors 630 and 640 are configured to sample the DAC output signal. Likewise, as before, single-pole, double-throw switches 470 and 480 and respectively corresponding capacitors 650 and 660 sample the output signal of the double-rate sampled signal integrator. Single-pole, double-throw switches 615 and 625 effectively realize a switched capacitive resistance due to capacitors 630, 640, 650, and 660. Furthermore, amplifier 115 has its output terminals coupled to a conventional comparator 700 that operates as a one-bit digital-to-analog converter. A conventional amplifier may be employed in the second stage because at low frequencies its "1/f" noise and any DC offset is reduced by the gain of the first stage amplifier, here amplifier 111. It will now be appreciated that the order of a delta-sigma modulator incorporating one or more double-rate sampled signal integrators is not limited in practice. Furthermore, any high-order modulator may achieve satisfactory performance by utilizing a double-rate sampled signal integrator in accordance with the invention, for low noise, and employing a conventional single-rate integrator elsewhere.

A method of performing sampled signal integration of a series of input voltage signal samples of an input voltage signal may be accomplished using a double-rate sampled signal integrator, as previously described, in accordance with the following method. The integrator may comprise either an operational or differential amplifier configured as a voltage signal integrator with at least two capacitors, as previously described. Where an operational amplifier is employed, one capacitor provides negative feedback between the output terminal and the negative input terminal while the other capacitor couples the positive input terminal to ground. Where a differential amplifier is employed both capacitors provide negative feedback between the input and output terminals. Externally derived clock pulses may be provided at a substantially predetermined frequency, $F_{CL}$, each of the pulses having a first phase and a second phase. This may be provided by a conventional externally-derived two-phase clock. Next, as illustrated by the previous embodiments of a double-rate sampled signal integrator in accordance with the invention, the input voltage signal of an externally-derived voltage source may be sampled on each phase of the clock pulses to provide the series of voltage signal samples. This may be accomplished, for example, by the network including capacitors and switches coupling the externally-derived voltage source to the input terminals. Likewise, as previously illustrated, electrical charge may be accumulated in the capacitors by injecting electrical charge on each phase of the clock pulses, the amount of electrical charge injected on the particular phase corresponding to the superposition of the voltage signal sample of the input voltage signal sampled on the particular phase and the voltage signal sample of the input voltage signal sampled on the immediately preceding phase. In the particular embodiments described, this superposition takes the form of an average of the particular sampled voltage signal values. As previously illustrated, the switches in the network coupling the voltage source to the integrator may be synchronized to insure that electrical charge is accumulated in the capacitors to accomplish double-rate integration on any, and typically every, cycle of the external clock. As previously described, the position and negative input voltage terminals of the amplifier should be voltage biased to provide a common-mode voltage bias for the integrator. The integrator produces a voltage output signal at the output voltage terminal of the amplifier at least after the injection and accumulation of electrical charge in the capacitors. The output voltage signal may then be decimated by sampling the signal either at the substantially predetermined clock frequency, $F_{CL}$, or by sampling the output signal at a frequency below the substantially predetermined clock frequency, $F_{CL}$. Where the amplifier comprises a differential amplifier including both a negative output voltage terminal and a positive output voltage terminal, as previously described, the polarity of the output voltage signals provided at the negative and positive output terminals of the amplifier may be periodically reversed at the frequency $f_C$ so as to modulate any voltage offset that may be present in the output voltage signals. Where the output voltage signal is not then decimated, this periodic reversal of polarity may comprise chopper stabilizing the output voltage signals, as previously described. Otherwise, the negative output voltage signal and the positive output voltage signal may be respectively decimated to reduce any offset or "1/f" noise in the manner previously described.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A double-rate sampled signal integrator comprising:
   a differential amplifier having a positive input terminal, a negative input terminal, a positive output terminal, and a negative output terminal;
   two capacitors, said capacitors coupling said amplifier output terminals to said amplifier input terminals so as to provide a negative feedback electrical signal;
   two more capacitors, each of said two more capacitors having a first terminal and a second terminal;
   two switches, each of said two switches being adapted to selectively couple the first terminal of a separate one of said two more capacitors between said amplifier input terminals;
   two more switches, each of said two more switches being adapted to selectively couple the second terminal of a separate one of said two more capacitors between the terminals of an externally derived voltage source; and
   a voltage bias coupled in shunt with each of said amplifier input terminals.

2. The sampled signal integrator of claim 1, wherein respective switches of said two switches are adapted to selectively couple the first terminal of respective capacitors of said two more capacitors between said amplifier input terminals so that, during one switching cycle at a substantially predetermined, externally-derived, clock rate, each respective capacitor of said two more capacitors switches amplifier input terminals.

3. The sampled signal integrator of claim 2, wherein respective switches of said two more switches are adapted to selectively couple the second terminal of respective capacitors of said two more capacitors between the terminals of an externally derived voltage source so that, during one switching cycle at the substantially predetermined, externally-derived, clock rate, each respective capacitor of said two more capacitors switches terminals of the externally derived voltage source.

4. The sampled signal integrator of claim 3, wherein the four switches are synchronized so that during one switching cycle at the substantially predetermined, externally-derived, clock rate, said two switches exchange amplifier input terminals at substantially the same time said two more switches exchange voltage source terminals.

5. The sampled signal integrator of claim 4, wherein at least one of said switches comprises a single-pole, double-throw switch.

6. The sampled signal integrator of claim 5, wherein said single-pole, double-throw switch comprises four electrically coupled CMOS transmission gates.

7. The sampled signal integrator of claim 4, wherein said voltage bias comprises at least two resistors and a bias voltage source, each of said resistors being coupled in shunt with a separate one of said amplifier input terminals and in series with said bias voltage source.

8. The sampled signal integrator of claim 4, wherein said voltage bias comprises a bias voltage source and at least two other switches and two other capacitors, each of said other capacitors having one terminal coupled to ground and having another terminal selectively coupled between said bias voltage source and a separate one of said amplifier input terminals by a separate one of said other switches.

9. The sampled signal integrator of claim 4, and further comprising two decimators, each of said amplifier decimators being coupled to a separate one of said amplifier output terminals, each of said decimators sampling the output voltage signal provided at the substantially predetermined, externally-derived, clock rate.

10. The sampled signal integrator of claim 9, wherein each of said decimators comprises a single-pole, double-throw switch adapted to selectively couple a switched capacitor between ground and the coupled amplifier output terminal at the substantially predetermined, externally-derived, clock rate.

11. A sampled signal integrator comprising:
a differential amplifier having input terminals and output terminals;
two capacitors, each of said two capacitors having a first and a second terminal;
two respective switches being adapted to selectively couple the first terminal of respective capacitors of said two capacitors between the input terminals of said amplifier;
two other respective switches being adapted to selectively couple the second terminal of respective capacitors of said two capacitors between the output terminals of said amplifier;
two more capacitors, each of said two more capacitors having a first and a second terminal;
the first terminal of each of said two more capacitors being coupled to a separate one of the input terminals of said amplifier;
two more respective switches being adapted to selectively couple the second terminal of respective capacitors of said two more capacitors between the terminals of an externally-derived voltage source;
said switches being synchronized so as to accomplish double-rate integration of a voltage signal provided by the externally-derived voltage source during one switching cycle at a substantially predetermined, externally-derived, clock rate; and
a voltage bias coupled in shunt with each of the input terminals of said amplifier.

12. A double-rate sampled signal integrator comprising:
a differential amplifier having a negative input terminal, a positive input terminal, a negative output terminal, and a positive output terminal;
six switches, each of said switches being adapted to selectively couple a first terminal between a second terminal and a third terminal;
at least two feedback capacitors, each of said feedback capacitors having two terminals;
the first and second switches of said six switches respectively selectively coupling the first terminal of the first and second capacitors of said feedback capacitors between the output terminals of said amplifier;
the third and fourth switches of said six switches respectively selectively coupling the second terminal of the first and second capacitors of said feedback capacitors between the input terminals of said amplifier;
two other capacitors, each of said other capacitors having two terminals, the first terminal of the first and second capacitors of said other capacitors being respectively coupled to the positive input terminal and the negative input terminal of said amplifier;
the fifth and sixth switches of said six switches respectively selectively coupling the second terminal of the first and second capacitors of said other capacitors between the terminals of an externally derived voltage source;
said six switches, each having a substantially predetermined, externally-derived, periodic switching cycle and being mutually synchronized so as to accomplish double-rate integration on each of said switching cycles; and
a voltage bias coupled in shunt with each of the input terminals of said amplifier.

13. A double-rate sampled signal integrator comprising:
an amplifier having at least a negative input voltage terminal, a positive input voltage terminal, and an output voltage terminal;
at least one feedback capacitor, said feedback capacitor coupling the amplifier output voltage terminal to the amplifier negative input voltage terminal to provide a negative feedback electrical signal;
two other capacitors, each of said other capacitors having two terminals;
four switches, each of said switches being adapted to selectively couple a first terminal between a second and a third terminal;
two switches of said four switches respectively selectively coupling the first terminal of respective capacitors of said two other capacitors between the terminals of an externally-derived voltage source;
two other switches of said four switches, respectively selectively coupling the second terminal of the respective capacitors of said two other capacitors between the input terminals of said amplifier;
said four switches, each having a substantially predetermined, externally-derived, periodic, switching cycle and being mutually synchronized so as to accomplish double-rate integration on each of said switching cycles; and
a voltage bias coupled in shunt with each of the input terminals of said amplifier.

14. The integrator of claim 13, and further comprising another capacitor coupling the amplifier positive input terminal to ground.

15. The integrator of claim 13, wherein at least one of said four switches comprises a single-pole, double-throw switch.

16. A double-rate sampled signal integrator comprising:
an amplifier having input-terminals and output terminals;
at least four capacitors, each of said capacitors having two terminals;
at least four switches, each of said switches being adapted to selectively couple one terminal between two other terminals; and
a common mode bias;
said common mode bias being coupled in shunt with each of the input terminals of said amplifier;
the terminals of said four capacitors and said four switches coupling an externally-derived voltage source to the amplifier input terminals and coupling the amplifier output terminals to the amplifier input terminals so as to accomplish double-rate integration of a voltage signal provided by the externally-derived voltage source on each respective switching cycle of said switches.

17. The integrator of claim 16, and further comprising a fifth switch and a sixth switch, each of said fifth switch and said sixth switch being adapted to couple one terminal between two other terminals; and wherein the terminals of two respective capacitors of said four capacitors each have a separate one of four switches of said six switches coupling the capacitor terminal between two terminals selected from the group consisting essentially of the amplifier input terminals and the amplifier output terminals, whereby a negative electrical feedback signal is provided from the amplifier output terminals to the amplifier input terminals; and wherein the first terminal of two other respective capacitors of said four capacitors each have a separate one of the two remaining switches of said six respective switches respectively coupling the capacitor terminal between the terminals of the externally-derived voltage source;

the second terminal of said two other respective capacitors being respectively coupled to a separate terminal of the amplifier input terminals;

said six switches, each having a substantially predetermined, periodic, externally-derived switching cycle and being mutually synchronized so as to accomplish double-rate integration of the voltage signal on each of said switching cycles.

18. A method of performing sampled signal integration of a series of voltage signal samples of an input voltage signal with an amplifier having two input terminals and at least one output terminal, said amplifier being configured as a voltage signal integrator with at least two capacitors, each of said two capacitors being coupled to a respective one of said input terminals, the first of said capacitor coupling said at least one output terminal in a negative feedback configuration, said method comprising the steps of:

providing externally derived clock pulses at a substantially predetermined frequency, $F_{CL}$, each of said pulses having a first phase and a second phase;

sampling the input voltage signal on each phase of said clock pulses to provide the series of voltage signal samples; and accumulating electrical charge in said capacitors by injecting electrical charge on each phase of said clock pulses, the amount of charge injected on the phase corresponding to the superposition of the voltage signal sample of the input voltage signal sampled on the phase and the voltage signal sample of the input voltage signal sampled on the immediately preceding phase.

19. The method of claim 18, wherein the accumulating step further includes the step of voltage biasing said input terminals to provide a common-mode bias for said integrator.

20. The method of claim 19, wherein said integrator produces an output voltage signal at said output terminal at least after the injected electrical charge is accumulated in said capacitors; and further comprising the step of decimating the output voltage signal.

21. The method of claim 20, wherein the step of decimating the output voltage signal comprises sampling the output voltage signal at the substantially predetermined frequency, $F_{CL}$.

22. The method of claim 20, wherein the step of decimating the output voltage signal comprises sampling the output voltage signal at a frequency below the substantially predetermined frequency $F_{CL}$.

23. The method of claim 19, wherein said amplifier comprises a differential amplifier, said at least one output terminal constituting a positive output voltage terminal, the output voltage signal constituting a positive output voltage signal, said differential amplifier further including a negative output voltage terminal providing a negative output voltage signal, the second of said capacitors coupling said negative output voltage terminal in a negative feedback configuration; and further comprising the step of periodically reversing the polarity of the provided voltage output signals at a substantially predetermined, externally-derived frequency, $f_C$, so as to modulate any voltage offset in the voltage output signals.

24. The method of claim 23, wherein the step of periodically reversing the polarity of the voltage output signals comprises chopper stabilizing the differential amplifier.

25. The method of claim 23, and further comprising the step of decimating respectively the negative output voltage signal and the positive output voltage signal.

* * * * *